US007635860B2

(12) United States Patent  (10) Patent No.: US 7,635,860 B2
Inoue et al.  (45) Date of Patent: Dec. 22, 2009

(54) MANUFACTURING METHOD OF ORGANIC THIN-FILM TRANSISTORS AND EQUIPMENT FOR MANUFACTURING THE SAME (75) Inventors: Tomohiro Inoue, Tsukuba (JP); Akira Doi, Hitachinaka (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 260 days.

(21) Appl. No.: 11/656,220

(22) Filed: Jan. 19, 2007

(65) Prior Publication Data

US 2007/0176202 A1  Aug. 2, 2007

(30) Foreign Application Priority Data

Feb. 2, 2006  (JP)  ............................. 2006-025197

(51) Int. Cl.
*H01L 35/24* (2006.01)
(52) U.S. Cl. .......... 257/40; 257/E21.114; 257/E21.153; 257/E21.174; 257/192; 438/99; 438/497; 118/73
(58) Field of Classification Search ................... 257/40, 257/E21.114
See application file for complete search history.

(56) References Cited

U.S. PATENT DOCUMENTS

| 6,436,482 | B2 | 8/2002 | Katsumata | |
| 2003/0148024 | A1* | 8/2003 | Kodas et al. | ................. 427/125 |
| 2004/0234696 | A1* | 11/2004 | Hongo et al. | ................ 427/328 |
| 2006/0228533 | A1* | 10/2006 | Nakagawa | ................... 428/208 |
| 2006/0275061 | A1* | 12/2006 | Cao et al. | .................... 399/328 |

FOREIGN PATENT DOCUMENTS

| JP | 2001-094107 | 4/2001 |
| JP | 2004-253179 | 9/2004 |
| JP | 2004-256532 | 9/2004 |
| JP | 2005-079560 | 3/2005 |
| JP | 2005-093542 | 4/2005 |
| JP | 2005-277238 | 10/2005 |
| JP | 2005-336709 | 12/2005 |
| JP | 2006-147843 | 6/2006 |
| KR | 2002-0028622 | 4/2002 |
| KR | 10-0441570 | 7/2004 |

* cited by examiner

*Primary Examiner*—Tu-Tu V Ho
(74) *Attorney, Agent, or Firm*—Townsend and Townsend and Crew LLP

(57) ABSTRACT

To increase productivity of organic thin-film transistors, in an organic thin-film transistor manufacturing equipment, a liquid containing at least either one of a wiring material and a semiconductor material is coated on a substrate to form a number of organic thin-film transistors. Substrate carrying means carry the substrate. The substrate is heated by a first heating means, and the temperature of the substrate is controlled by a controller. The liquid containing at least either one of the wiring material and the semiconductor material is heated by a second heating means, and the temperature of this liquid is controlled also by the controller.

6 Claims, 7 Drawing Sheets

MANUFACTURING METHOD OF ORGANIC THIN-FILM TRANSISTORS AND EQUIPMENT FOR MANUFACTURING THE SAME

CROSS-REFERENCE TO RELATED APPLICATION

The present application claims priority from Japanese Patent Application No. JP 2006-025197 filed on Feb. 2, 2006, the content of which is hereby incorporated by reference into this application.

TECHNICAL FIELD OF THE INVENTION

The present invention relates to a manufacturing method of organic thin-film transistors and an equipment for manufacturing the same.

BACKGROUND OF THE INVENTION

An example of a conventional organic thin-film transistor is disclosed in Japanese Patent Application Laid-Open Publication No. 2001-94107 (Patent Document 1) In the organic thin-film transistor disclosed in this gazette, in order to obtain high mobility, a gate electrode, a gate insulator, an organic semiconductor layer, a source electrode, a drain electrode, and a protection film are formed on the surface of a substrate, and a contact angle of pure water on the surface of the gate insulating layer is set equal to or larger than 50 degrees and equal to or smaller than 120 degrees. Another example of the organic thin-film transistor is disclosed in Japanese Patent Application Laid-Open Publication No. 2004-256532 (Patent Document 2) In this gazette, conjugated-system polymer compound, such as polyphenylene vinylene or polythiophene, or an aromatic compound including mainly a polyacene compound, such as anthracene, tetracene, or pentacene, is used as a transistor material. Of these compounds, the polyacene compound has high carrier mobility to speed up the operating speed of a filed-effect transistor (FET).

An example of a conventional functional element manufacturing method is disclosed in Japanese Patent Application Laid-Open Publication No. 2004-253179 (Patent Document 3). In the functional element manufacturing method disclosed in this gazette, embrocation for functional layer formation containing a solvent is coated on a substrate in a pattern shape through an ink jet method so that the capability of the functional element is not changed both at its peripheral portion and center portion. Then, before the solvent is volatilized, the embrocation is rapidly solidified.

SUMMARY OF THE INVENTION

In the forming of a semiconductor layer using an organic semiconductor material disclosed in Patent Document 1, pentacene is subjected to vacuum deposition to form a semiconductor layer. To do this, equipment for evacuation has to be required, such as a vacuum vessel, a pump, and others, resulting in a complex equipment and high cost.

In the method of forming a transistor material disclosed in Patent Document 2, when liquid pentacene is coated at room temperature, a sufficient crystal growth cannot be expected. Therefore, a heating process is performed after coating to grow a crystal, thereby increasing a particle diameter of the crystal. However, since it is difficult to simultaneously perform coating and heating, productivity in the semiconductor layer forming process is low. Also, it is difficult to accurately control crystal growth. Therefore, making properties of the coating film uniform and simplifying the equipment are not sufficiently taken into consideration. Furthermore, in Patent Document 3, although embrocation is rapidly solidified to make the film thickness uniform, controlling crystalline orientation of the semiconductor to increase the capability of the semiconductor is not taken into consideration.

The present invention is devised in view of the above inconveniences of the conventional technology. An object of the present invention is to increase productivity of organic thin-film transistors. Another object of the present invention is to achieve a high-performance organic thin-film transistor.

A feature of the present invention achieving the above objects is that in an organic thin-film transistor manufacturing equipment in which a substrate is coated with a liquid containing at least either one of a wiring material and a semiconductor material to form a number of organic thin-film transistors on the substrate, the equipment includes: a substrate carrying means that carries the substrate; a first heating means that heats the substrate; a substrate temperature controlling means that controls a temperature of the substrate heated by the first heating means; a second heating means that heats the liquid containing at least either one of the wiring material and the semiconductor material; a liquid temperature controlling means that controls a temperature of the liquid heated by the second heating means.

In this feature, the substrate temperature controlling means generates a thermal gradient in a direction in which the substrate is carried, and preferably causes the substrate to be heated so that a temperature on a forward side in a substrate carrying direction is higher than a temperature on a backward side in the substrate carrying direction. Also, the substrate temperature controlling means is preferably disposed on a back surface side of a liquid-coated surface of the substrate. Furthermore, a forming apparatus that forms a drain electrode on the substrate is provided, and the substrate carrying means carries the substrate in a direction approximately orthogonal to a longitudinal direction of the drain electrode formed by the forming apparatus.

In the above feature, the substrate carrying means has a plurality of rollers, and the heating means is preferably provided to at least one of the plurality of rollers. Still further, temperature measuring means is preferably capable of measuring temperatures of at least two points on the substrate, and disposed at a position where a temperature of at least one of the organic thin-film transistors formed on the substrate can be measured.

Another feature of the present invention achieving the above objects is that, in an organic thin-film transistor manufacturing method including: a substrate carrying step of carrying a substrate to a predetermined position; and a liquid layer coating step, to be performed after the substrate carrying step, of coating the substrate with a liquid containing at least either one of a wiring material and a semiconductor material, and a temperature of the substrate is heated to a predetermined temperature in both of the substrate carrying step and the liquid layer coating step. In this feature, it is preferable that the liquid layer coating step include a liquid coating step and a substrate heating step, and a substrate carrying speed in the liquid-coating step and a substrate carrying speed in the substrate heating step to be approximately equal to each other.

According to the present invention, the substrate is coated with a semiconductor and heated on the same carrying route, thereby increasing productivity of organic thin-film transistors. Also, the semiconductor layer is heated to control a drying speed (rate) of the semiconductor layer, thereby achieving high-performance organic thin-film transistors.

Furthermore, the back surface side of the substrate is used for carrying and heating, thereby preventing organic contamination of the semiconductor layer and wiring from a carrier device and a heating device.

DESCRIPTIONS OF THE PREFERRED EMBODIMENTS

Figure 1:
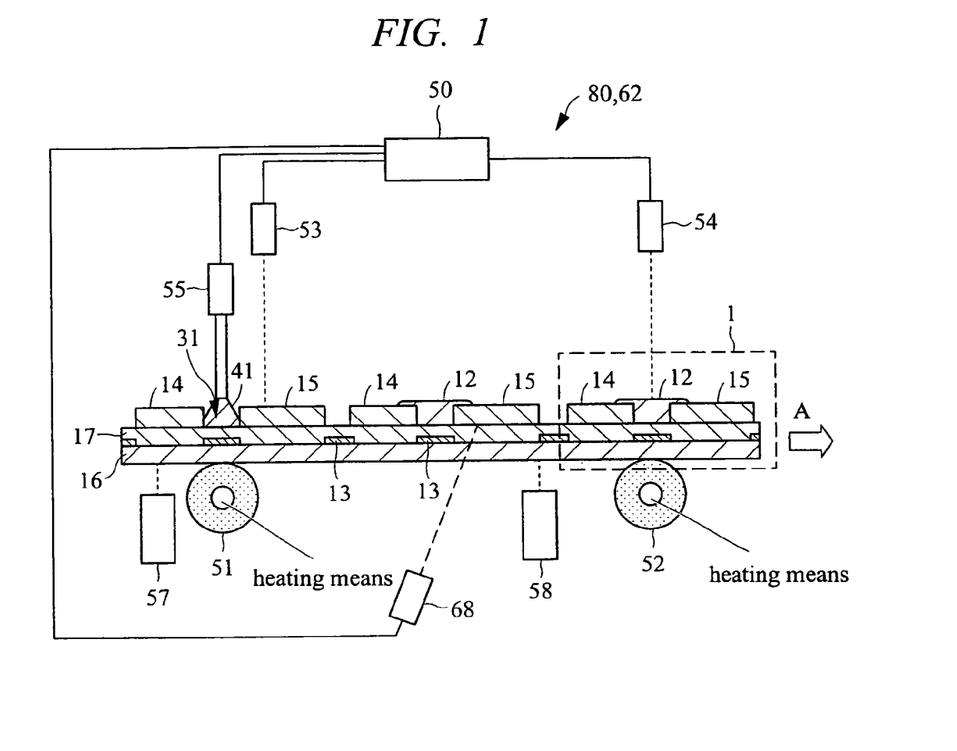
FIG. 1 is a system diagram of one embodiment of an equipment that manufactures an organic thin-film transistor according to the present invention.
Figure 6A:
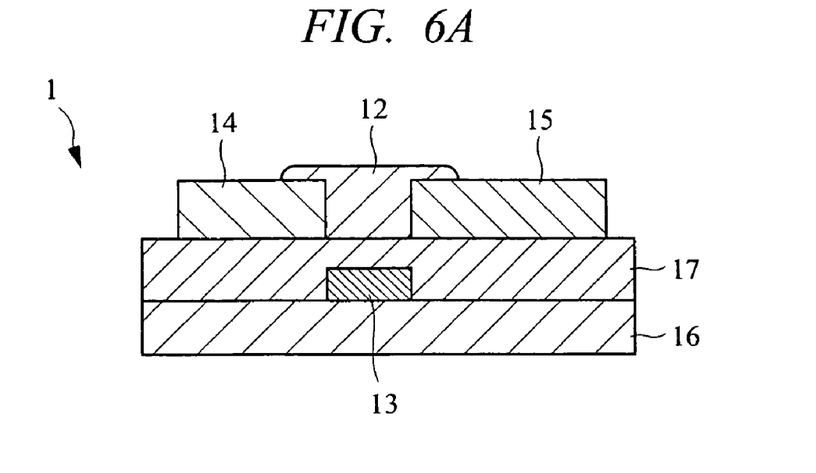
FIG. 6A is a detailed vertical cross-section view of the organic thin-film transistor shown in FIG. 1.
Figure 6B:
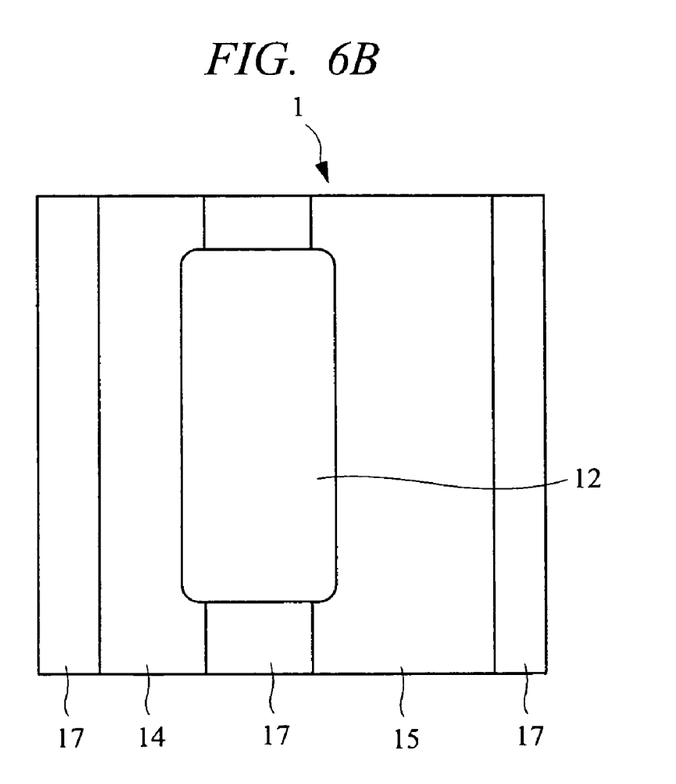
FIG. 6B is a plan view of the organic thin-film transistor shown in FIG. 1.

The organic thin-film transistor manufacturing method according to the present invention is described below with reference to the drawings. FIG. 1 as a vertical cross sectional view of one embodiment of an equipment 80 that manufactures an-organic thin-film transistor (TFT) 1. On carrier rollers 51 and 52 disposed so as to be spaced apart from each other, a substrate 16 to be processed is placed. The carrier rollers 51 and 52 carry the substrate 16 intermittently in a direction denoted by an arrow A. On the upper surface of the substrate 16, an organic thin-film transistor 1 is formed, details of which are shown in FIGS. 6A and 6B. FIG. 6A is a cross-sectional view of the organic thin-film transistor 1, whilst FIG. 6B is a plan view thereof. Here, a surface on which a semiconductor layer 12 is formed is referred to as a front surface of the substrate 16, whilst a surface opposite thereto is referred to as a back surface of the substrate 16. A gate electrode 13 is formed at a predetermined position on the front surface of the substrate 16. A gate insulator 17 is formed so as to cover a portion of the front surface of the substrate 16 where the gate electrode 13 is not formed and the upper surface of the gate electrode 13.

On the upper surface of the gate insulator 17, a drain electrode 14 and a source electrode 15 forming as a pair are formed so as to be spaced apart from each other. A space 41 between the drain electrode 14 and the source electrode 15 corresponds to the position of the gate electrode 13. In this space 41, a semiconductor layer 12 is buried. The upper surface of the semiconductor layer 12 extends to the upper surface of the drain electrode 14 and the source electrode 15 forming a pair, but both ends in a width direction (a vertical direction in FIG. 6B) of the upper surface of the semiconductor layer 12 do not extend to ends of the organic thin-film transistor 1.

An applicator 55 is disposed above a position where the space al between the drain electrode 14 and the source electrode 15 forming as a pair is located when the rotation of the carrier rollers 51 and 52 are stopped to pose carrying of the substrate 16. The applicator 55 has a nozzle portion from which semiconductor solution 31 is injected from above. The applicator 55 is connected to a controller 50. To the controller So, temperature sensors 53 and 54 are connected to allow detection of the temperature of each of the electrodes 14 and 15 and the semiconductor layer 12.

On the back surface side of the substrate 16 which the carrier rollers 51 and 52 abutting on, substrate position detecting means 57 and 58 are disposed so as to be able to detect the position of the substrate 16 in a noncontact manner on the back surface side of the substrate 16 between the carrier rollers 51 and 52, a laser source 68 capable of heating the semiconductor layer 12 is disposed.

Figure 2:
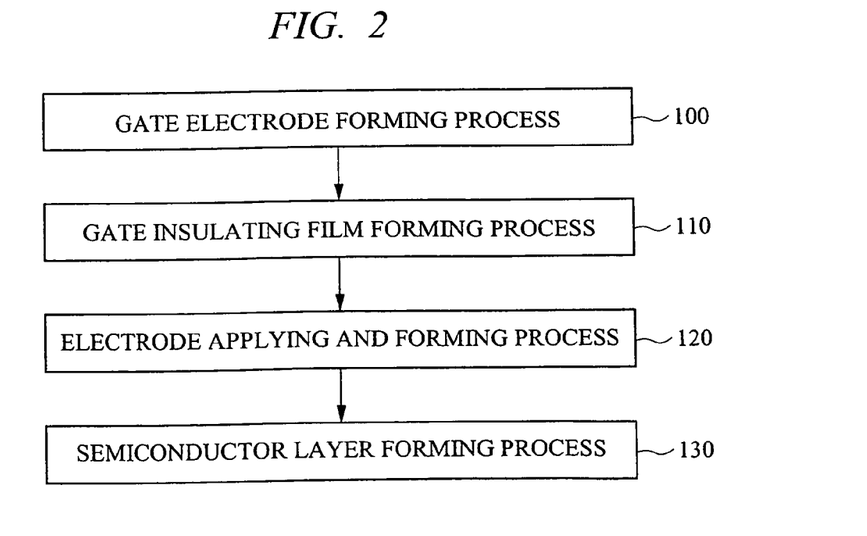
FIG. 2 is a flowchart of an organic thin-film transistor manufacturing process according to the present invention.

By using the organic thin-film transistor manufacturing equipment 80 shown in FIG. 1, the method of manufacturing the organic thin-film transistor 1 is described with reference to FIG. 2. The method of manufacturing the organic thin-film transistor 1 broadly includes a gate electrode forming process 100, a gate insulator forming process 110, a source and drain electrodes forming process 120, and a semiconductor layer forming process 130. Details of each of these processes are described below. Here, an insulating material is used for the substrate 16. Examples of a material used as the insulating material are: an inorganic material such as glass, quartz, or alumina sinter; insulating plastic, such as polyimide, polyethylene, polyarylate, polysulfone, polyphenylenesulfide, or polyetheretherketone; and a hybrid substrate, which is a combination of an inorganic material and insulating plastic. In the embodiment described below, a glass substrate is used as the substrate 16.

Figure 3:
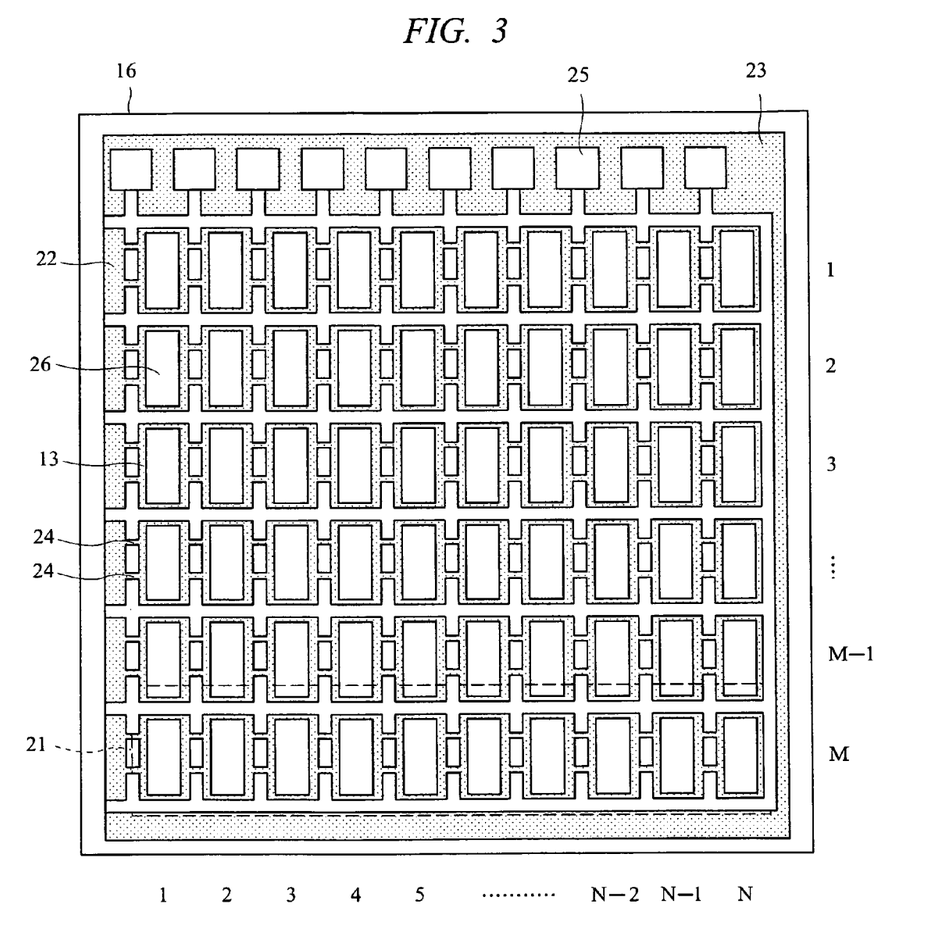
FIG. 3 is a plan view of a substrate where a plurality of organic thin-film transistors are disposed according to the present invention.

(1) Gate Electrode Forming Process 100:

The gate electrodes 13 are first formed on the substrate 16 having an approximately flat front surface. A top view of the substrate 16 when the gate electrodes 13 are formed is shown in FIG. 3. A wiring pattern of the gate electrodes 13 each formed in a rectangular frame shape with an opening 26 is formed on the substrate 16. In the embodiment shown in FIG. 3, the gate electrodes 13 are formed in a matrix shape with N columns in a horizontal direction and M rows in a vertical direction for use in an active matrix TFT. To fabricate the gate electrodes 13, a chrome thin-film having a film thickness of 150 nm is deposited on the front surface of the substrate 16 by a spatter device not shown. Then, any excess portion is removed through photolithography.

In the present embodiment, chrome is used as the gate electrodes 13. However, for the gate electrodes 13, tantalum, molybdenum, nickel, an alloy of these metals, a conducting polymer, such as polyannin, polypyrrole, or poly(3,4-ethylene dioxythiophere) (PEDOT) can be used. Also, although the gate electrodes 13 are formed through spattering in the present embodiment, the pattern can be formed through a print process, such as ink jet, spray, screen, or photolithography.

Two gate electrodes 13 adjacent to each other in the horizontal direction are connected to each other via at least two connecting portions 24 disposed between the gate electrodes 13 and 13. N gate electrodes 13 in the horizontal direction connected via the connecting portions 24 form one of M gate electrode groups 21. Gate electrodes 13 adjacent to each other in the vertical direction are insulated from each other, and the gate electrode groups 21 are also insulated from one another. At a left end of the gate electrode groups 21 formed in an M×N matrix, a rectangular gate terminal 22 connected via the connecting portions 24, which are similar to the connecting portions 24 connecting the gate electrodes 13 and 13, is disposed.

On each of a lower edge portion, a right edge portion, and an upper edge portion of the gate electrode groups formed in a matrix shape, an electrode for terminal formation 23 for formation of terminals of source and drain electrodes is disposed together with an insulating space, and is formed in an insulating manner around the M gate electrode groups 21. On the electrode for terminal formation 23 formed on the upper edge portion, openings 25 are formed each at a position corresponding to a space between the gate electrodes 13 and 13. In the openings 26 of the gate electrodes 13 and the openings 25 of the electrodes for terminal formation 23, source and drain electrodes are formed in a post-process.

(2) Gate Insulating Film Forming Process 110:

A $Si_3N_4$ film 17 having a thickness of 300 nm is formed on the front surface of the substrate 16 through Chemical Vapor Deposition (CVD); This $Si_3N_4$ film 17 is used as a gate insulator. When the gate electrodes 13 are made of tantalum or aluminum, tantalum oxide or aluminum oxide obtained through anodic oxidation of the gate electrodes 13 is used as the material of the gate insulator 17. Also, at the time of CVD, $SiO_2$ may be used. When a liquid is burnt after coating, burning is performed at 120° C. to 300° C. after coating by using polyimide, polyvinylphenol, polyvinyl alcohol, silicon oxide, or the like.

Figure 4:
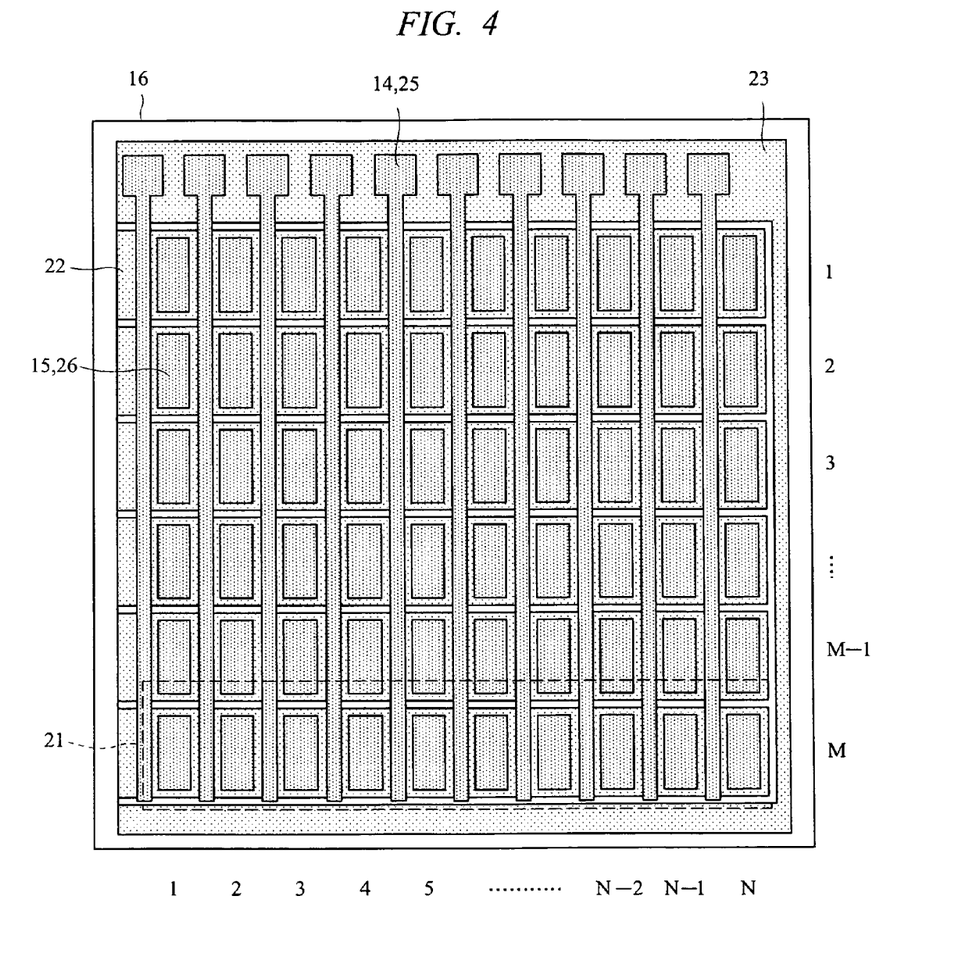
FIG. 4 is a plan view of a substrate where a plurality of organic thin-film transistors are disposed according to the present invention.

(3) Process 120 of Forming Source Electrodes and Drain Electrodes:

Details of the source electrodes 15 and the drain electrodes 14 are shown in FIG. 4. To form the source electrodes 15 and the drain electrodes 14, as shown in FIG. 4, the front surface of the gate insulator 17 is coated with conducting ink. N drain electrodes 14 are formed in the gate-electrode openings 25 and M×N source electrodes 15 are formed in the gate-electrode openings 26.

Figure 8:
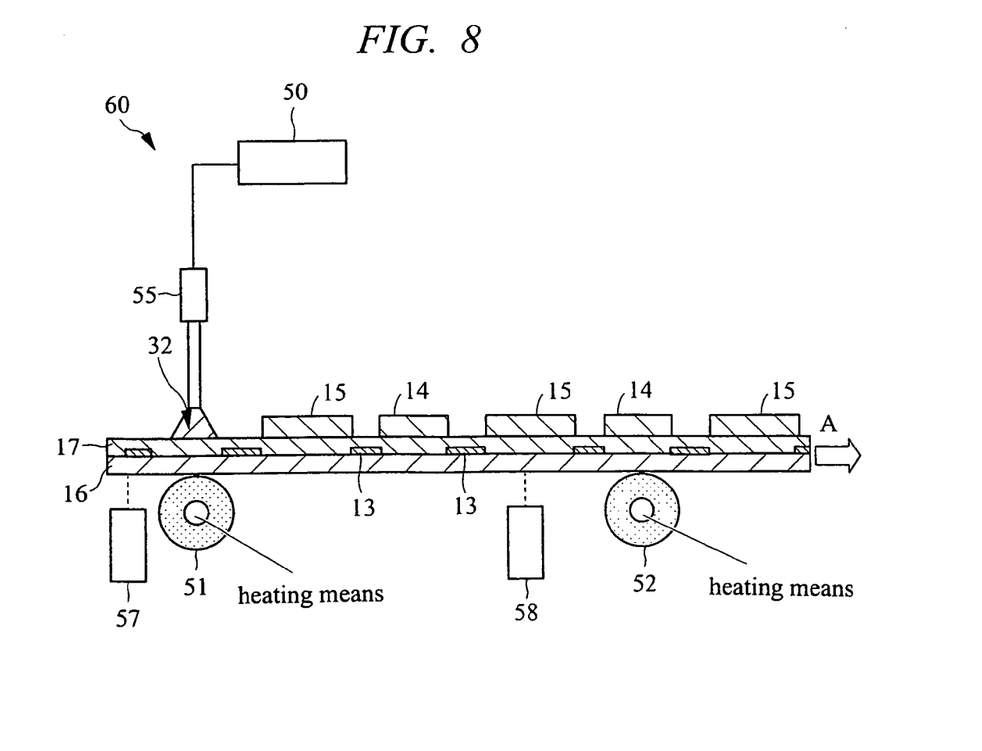
FIG. 8 is a system diagram of one embodiment of an apparatus that forms a source electrode and a drain electrode according to the present invention.

Details of a method of forming the source electrodes 15 and the drain electrodes 14 are described with reference to FIG. 8. A forming apparatus 60 that forms the source electrodes 15 and the drain electrodes; 14 has a structure similar to that of the organic thin-film manufacturing equipment 80 shown in FIG. 1. That is, the forming apparatus includes an applicator 55 capable of applying conducting ink 32 at a predetermined position, and two carrier rollers 51 and 52 that carry the substrate 16. On the front surface of the substrate 16, the gate electrodes 13 and the gate insulator 17 is formed in the gate insulator forming process 110. The position of the substrate 16 is detected by substrate position detecting means 57 and 58. According to the position of the substrate 16 detected by the substrate position detecting means 57 and 58, the applicator 55 and the carrier rollers 51 and 52 are controlled by the controller 50.

The conducting ink 32 for use in coating the source electrodes 15 and the drain electrodes 14 is a liquid containing, as a base material, metallic microparticles, metallic complex, or conducting polymer. Since this conducting ink 32 applied to the substrate 16 is burnt to form the source electrodes 15 and the drain electrodes 14, a material having a sufficiently low resistance value after burning is used as the conducting ink 32.

Specifically, the conductive ink 32 is used with metallic microparticles or metallic complex having a diameter equal to or smaller than approximately 10 μm and containing Au, Ag, Pd, Pt, Cu, Ni, or the like as a main component being dispersed into a solvent, such as water, toluene, xylene, or thee like. The conductive ink 32 may be an aqueous solution, such as PEDOT (poly(3,4-ethylene dioxythiophene)), polyannin, or polypyrrole, doped with polystyrene sulfonate (PSS), which is a conducting polymer. In the present embodiment, a conductive ink with Ag being dispersed into a solvent containing water as a main component is used.

For the applicator 55, a print process using dispenser, ink jet, spray or the like allowing solution application is used. In the present embodiment, a dispenser that adjusts the pressure of a nozzle to discharge a liquid is used. On this dispenser 55, a laser displacement meter not shown that measures distance from the substrate 16 is mounted. Based on the output of the laser displacement meter, the conductive ink 32 is applied with a gap between the dispenser 55 and the substrate 16 being kept constant.

The substrate position detecting means 57 and 58 each has a CCD camera. This CCD camera captures an image of the substrate 16. The captured image is image-processed by image processing means to extract the gate electrode 13. Based on the position of the gate electrode 13, the position of the substrate 16 is detected.

Figure 7:
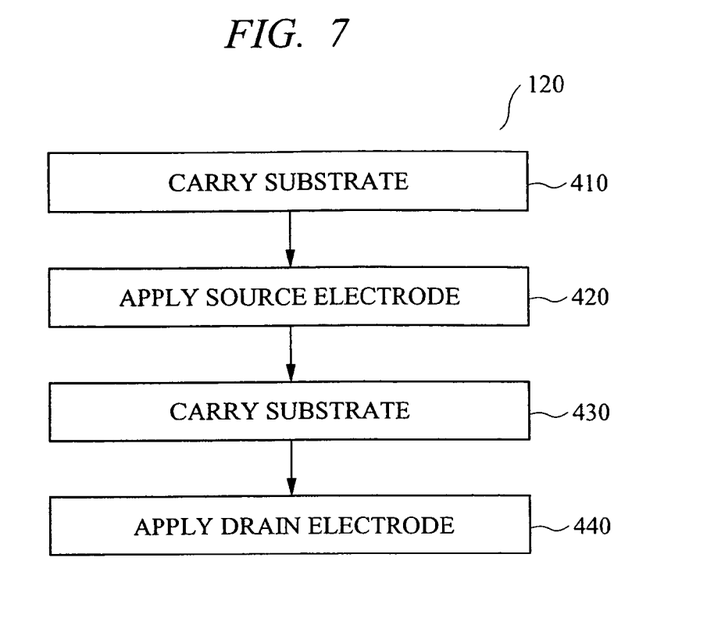
FIG. 7 is a detailed flowchart of a process of step 120 shown in FIG. 2.

A detailed flow of the process of forming source electrodes and drain electrodes is shown in FIG. 7 as a flowchart. FIG. 7 is a flowchart of an applying operation controlled by the controller 50. In step 410, a stepping motor drives the carrier rollers 51 and 52. With the carrier rollers 51 and 52 being driven, the substrate 16 is carried to a predetermined position in an A direction (from left to right in FIG. 8). At this time, the substrate 16 is carried in a direction orthogonal to a longitudinal direction of the wiring of the drain electrode 14. The driving accuracy of the carrier rollers 51 and 52 is 20 μm, which is one step of the stepping motor.

In step 420, the dispenser 55 sequentially applies the conducting ink 32 to the openings 26 from the first row to the M-th row of the first column. With this, M source electrodes 15 in the first column are formed through application. In step 430, in order to form the drain electrodes 14 in the first column adjacent to the source electrodes 15 in the first column, one end of the substrate 16 (the lower end in FIG. 4) is moved to the coating position of the dispenser 55.

In step 440, the dispenser 55 applies the conducting ink 32 up to the openings 26 in the first column to form one drain electrode 14 extending in a width direction (the vertical direction in FIG. 4). Next, the substrate 16 is moved to the opening 26 of the second column. These steps 410 to 440 are repeated N times. With this, M×N source electrodes 15 and N drain electrodes 14 are formed on the gate insulator 17. After forming the source electrodes 15 and the drain electrodes 14 through application, the conducting ink 32 is burnt at an appropriate temperature. The burnt source electrodes 15 and drain electrodes 14 each has a film thickness of approximately 100 nm.

Figure 5:
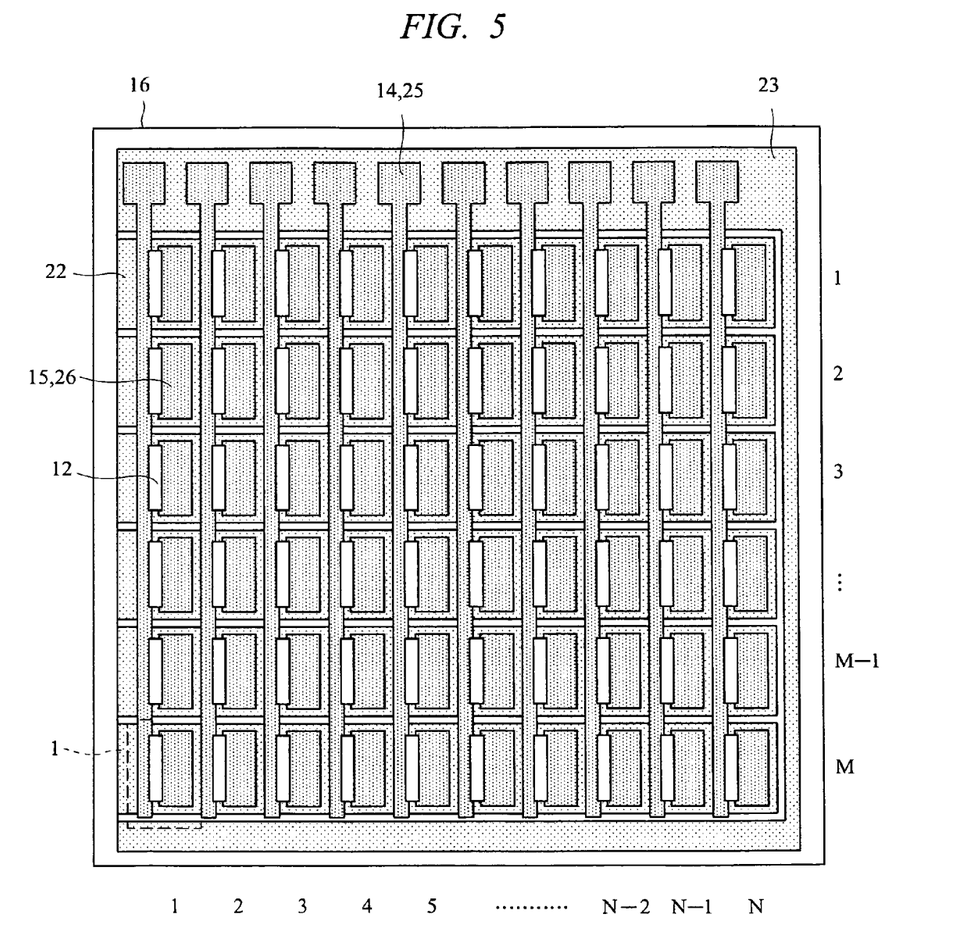
FIG. 5 is a plan view of a substrate where a plurality of organic thin-film transistors are disposed according to the present invention.

(4) Semiconductor Layer Forming Process 130:

FIG. 5 is a top view of the substrate 16 after forming the semiconductor layer 12. In order to form organic TFTs with M rows and N columns, the semiconductor layer 12 is formed through coating so as to cover each surface of the source electrodes 15 and the drain electrodes 14 formed in the process 120 of forming the source electrodes 15 and the drain electrodes 14, and an insulating film having the gate electrodes 13 thereunder formed in the gate insulating film forming process 110.

In order to form the semiconductor layer 12, a forming equipment 62 for the semiconductor layer 12 similar to the organic thin-film transistor manufacturing equipment 80 shown in FIG. 1 is used. The forming equipment 62 for the semiconductor layer 12 has an applicator 55 capable of applying a semiconductor solution containing a semiconductor material at a predetermined position. In the process of forming the source electrodes 15 and the drain electrodes 14, the carrier rollers 51 and 52 carry the substrate 16 having formed on its front surface the source electrodes 15 and the drain electrodes 14. The substrate position detecting means 57 and 58 detect the position of the substrate 16. The temperature of the substrate 16 is detected by the temperature sensors 53 and 54. Based on the outputs of the substrate position detecting means 57 and 58 and the temperature sensors 53 and 54, the controller 50 controls the applicator 55 and the carrier rollers 51 and 52.

The substrate position detecting means 57 and 58 each has a CCD camera. The CCD camera captures an image of the substrate 16. The captured image is image-processed by an image processing means to extract the gate electrode 13, the source electrode 15, and the drain electrode 14. With this, the position that forms the semiconductor layer 12 on the substrate 16 is detected. The semiconductor material, which is a solution 31 the applicator 55 applies, is conjugated-system polymer compound, such as polyphenylene vinylene or polythiophene, or an aromatic compound including mainly a polyacene compound, such as anthracene, tetracene, or pentacene. In the present embodiment, a solution obtained by dissolving pentacene in a solvent, such as toluene or trichlorobenzene is used.

For the applicator 55, as with the applicator that applies the source electrodes 15 and the drain electrodes 14, a print process using dispenser, ink jet, spray or the like allowing solution application is used. In the present embodiment, a dispenser is used. To the dispenser 55, a heater not shown that can heat the semiconductor solution 31 up to 300° C. is mounted. By using the heater, the semiconductor solution 31 being heated is applied.

As with the forming apparatus 60 that forms the source electrodes 15 and the drain electrodes 14, the carrier rollers 51 and 52 are driven by the stepping motor. One step of the stepping motor is 20 μm. The carrier rollers 51 and 52 are hollow cylindrical tubes made of metal. Inside a hollow portion of each of the carrier rollers 51 and 52, a heat source that heats the carrier roller is mounted. As the heat source, for example, a halogen lamp or an induction heater (IH) coil capable of heating the carrier rollers 51 and 52 up to approximately 200° C. is used. Here, the surfaces of the carrier rollers 51 and 52 are covered with silicon rubber so as to reliably carry the substrate 16 without slipping.

The temperature sensors 53 and 54 measure the surface temperatures of the gate insulator 17, the source electrodes 15, and the drain electrodes 14 formed on the substrate 16. In the present embodiment, radiation thermometers capable of noncontact measurement are used. Based on the outputs of the temperature sensors 53 and 54, the carrier rollers 51 and 52 are temperature-controlled. Therefore, the detection position of the temperature sensor 53 is set above the carrier roller 51. Similarly, the detection position of the temperature sensor 54 is set above the carrier roller 52.

Figure 9:
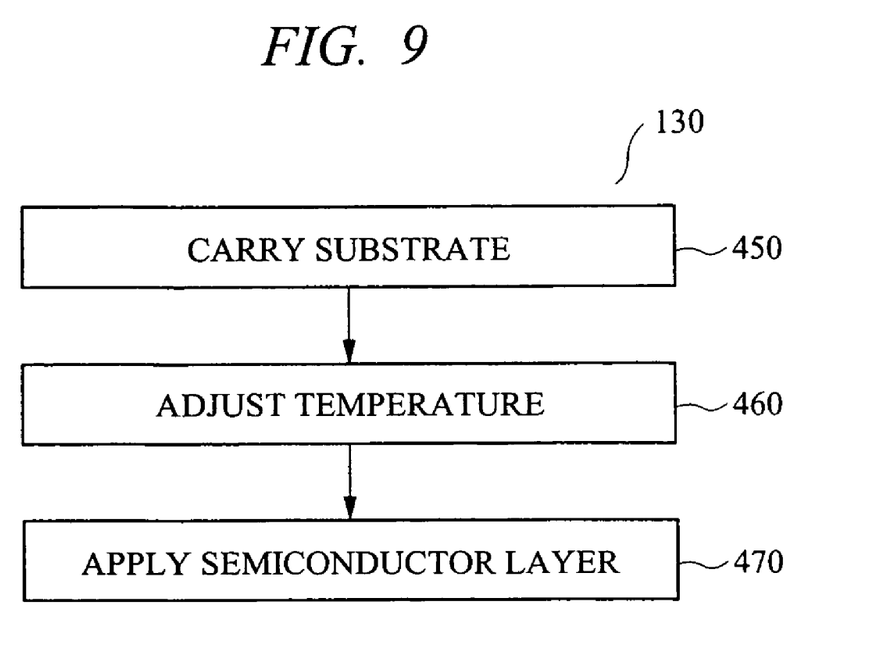
FIG. 9 is a detailed flowchart of a process of step 130 shown in FIG. 2.

The operation of the controller 50 included in the forming equipment 62 for the semiconductor layer 12 is shown in FIG. 9 as a flowchart. In step 450, the stepping motor is driven to drive the carrier rollers 51 and 52. The carrier rollers 51 and 52 carry the substrate 16 in an A direction (from left to right in the drawing). At this time, the substrate 16 is carried in a direction orthogonal to a longitudinal direction of the wiring of the drain electrode 14. The substrate position detecting means 57 and 58 detect the position of the substrate 16. Based on the outputs of the substrate position detecting means 57 and 58, the substrate 16 is moved to the semiconductor applying position of the dispenser 55.

In step 460, heating is performed by a halogen lamp or an IH coil so that the temperature of the semiconductor solution 31 before being applied by the dispenser 55 and the temperature of the upper surface of the substrate 16 to be detected by the temperature sensors 53 and 54 become predetermined values. In the present embodiment, the semiconductor solution 31 is set at 120° C., the detection temperature of the temperature sensor 53 is set at 80° C., and the detection temperature of the temperature sensor 54 is set at 200° C. With this, a thermal gradient occurs in a direction of the rollers 51 and 52 on the substrate 16. Since the semiconductor solution 31 applied to the substrate 16 has a large solvent evaporation amount at a high temperature side, a flow directed from a lower temperature side to a high temperature side occurs inside the semiconductor solution 31. At this time, the solvent is dried. Since semiconductor molecules in the semiconductor solution 31 move together with the internal flow in the course of drying the solvent, uniformity of orientation of the semiconductor molecules are improved, thereby making the crystalline orientation of a solvent crystal film uniform.

In step 470, as with the time of application for forming the source electrodes 15 and the drain electrodes 14, the dispenser 55 sequentially applies the semiconductor solution 31 to coating positions from the first row to the M-th row of the first column. With this, M semiconductor layers 12 in the first column are formed through coating. After coating to the first column is completed, the procedure returns to step 450 for coating the second semiconductor layer 12 of the second column. Then, the substrate 16 is moved to the coating position of the semiconductor layer 12 of the second column. These steps 450 to 470 are repeated for the size of the substrate 16, that is, N times, thereby forming the semiconductor layers 12 with M-rows×N-columns thorough coating on the gate insulator 17. Finally, on the substrate 16, M×N organic thin-film transistors 1 are formed each having the gate electrodes 13, the gate insulator 17, the source electrodes 15, the drain electrodes 14, and the semiconductor layers 12.

In the present embodiment, heating in the semiconductor layer forming process 130 may be performed by using a laser 68. Specifically, the laser 68 for use in heating the semiconductor layer 12 is disposed, as shown in FIG. 1, on the back surface side of the substrate 16. With this, the source electrodes is adjacent to the semiconductor layer 12 formed through coating can be radiated with laser light. The output of the laser 68 is controlled by the controller 50. The laser 68 includes laser-light deflection controlling means not shown for allowing the rows of the semiconductor layers 12 formed on the substrate 16 to be scanned with laser light. In the present embodiment, galvanometer mirror capable of optical scanning with high accuracy at high speed is used as the deflection controlling means.

The laser 68 disposed on the back surface side of the substrate 16 heats the semiconductor layer 12 from the source electrode 15 side radiated with laser light from the laser 68. Therefore, a thermal gradient occurs on the semiconductor layer 12. With this thermal gradient, a degree of drying the semiconductor solution 31 after forming the semiconductor layer 12 through coating is controlled. In the present embodiment, in order to increase heating efficiency, third-harmonic wave (wavelength of 355 nm) of a YAG laser is used. When the source electrodes 15 are made of Ag, a light absorbing ratio is equal to 5% or lower, with the wavelength of laser light of approximately 500 nm. Thus, heating efficiency is low. However, when the wavelength of laser light is equal to or shorter than 500 nm, the absorbing ratio is gradually increased. When the wavelength of laser light is 350 nm, approximately 30% is absorbed. As a result, the substrate 16 can be efficiently heated.

Here, in place of the YAG laser, a semiconductor pump laser $YVO_4$ can be used. Since the third-harmonic wave of the semiconductor pump laser $YVO_4$ also has the same wavelength of 355 nm, heating capability identical to that of the third-harmonic wave of the YAG laser can be expected. With the wavelength equal to or shorter than 300 nm, the absorbing ratio of laser light is equal to or larger than 80%. Therefore, for example, when an excimer laser having a wavelength of 193 nm or a YAG laser having a wavelength of 266 nm is used, a further increase in heating capability can be expected. The present invention is not restricted to the case of radiating the source electrodes 15 with laser light. Similar effects can be achieved by radiating the drain electrodes 14 adjacent to the semiconductor layer 12 with laser light.

In the present embodiment, laser light from the laser 68 is applied from the back surface side of the substrate 16. However, if means for preventing deposition of pollutants generated from the laser 68, and its deflecting means on the substrate 16 is provided, laser light from the laser 68 can be applied from the front surface side.

What is claimed is:

1. An organic thin-film transistor manufacturing equipment which applies to coat a liquid containing at least either one of a wiring material and a semiconductor material on a substrate to form a number of organic thin-film transistors on the substrate, comprising:
    a substrate carrying means that carries the substrate;
    a first heating means that heats the substrate;
    a substrate temperature controlling means that controls a temperature of the substrate heated by the first heating means;
    a second heating means that heats the liquid containing at least either one of the wiring material and the semiconductor material;
    a liquid temperature controlling means that controls a temperature of the liquid heated by the second heating means are included, wherein the first heating means is disposed on a back surface side of a liquid-coated surface of the substrate; and
    a temperature measuring means capable of measuring temperatures of at least two points on the substrate, and the temperature measuring means is disposed at a position where a temperature of at least one of the organic thin-film transistors formed on the substrate can be measured.

2. The organic thin-film transistor manufacturing equipment according to claim 1, wherein the substrate temperature controlling means generates a thermal gradient in a direction in which the substrate is carried, and causes the substrate to be heated so that a temperature on a forward side in a substrate carrying direction is higher than a temperature on a backward side in the substrate carrying direction.

3. The organic thin-film transistor manufacturing equipment according to claim 1, further comprising a forming apparatus that forms a drain electrode on the substrate, wherein the substrate carrying means carries the substrate in a direction approximately orthogonal to a longitudinal direction of the drain electrode formed by the forming apparatus.

4. An organic thin-film transistor manufacturing equipment which applies to coat a liquid containing at least either one of a wiring material and a semiconductor material on a substrate to form a number of organic thin-film transistors on the substrate, comprising:
    a substrate carrying means that carries the substrate;
    a first heating means that heats the substrate;
    a substrate temperature controlling means that controls a temperature of the substrate heated by the first heating means;
    a second heating means that heats the liquid containing at least either one of the wiring material and the semiconductor material;
    a liquid temperature controlling means that controls a temperature of the liquid heated by the second heating means are included, wherein the substrate carrying means has a plurality of rollers, and heating means is provided to at least one of the plurality of rollers; and
    a temperature measuring means capable of measuring temperatures of at least two points on the substrate, and the temperature measuring means is disposed at a position where a temperature of at least one of the organic thin-film transistors formed on the substrate can be measured.

5. The organic thin-film transistor manufacturing equipment according to claim 4, wherein the substrate temperature controlling means generates a thermal gradient in a direction in which the substrate is carried, and causes the substrate to be heated so that a temperature on a forward side in a substrate carrying direction is higher than a temperature on a backward side in the substrate carrying direction.

6. The organic thin-film transistor manufacturing equipment according to claim 4, further comprising a forming apparatus that forms a drain electrode on the substrate, wherein the substrate carrying means carries the substrate in a direction approximately orthogonal to a longitudinal direction of the drain electrode formed by the forming apparatus.

* * * * *